United States Patent
Dahlgren et al.

(10) Patent No.: US 8,227,692 B2
(45) Date of Patent: Jul. 24, 2012

(54) EXPLOSION-PROOF ENCLOSURE

(75) Inventors: Erik Dahlgren, Foxboro, MA (US);
Scott M. Ewen, Leominster, MA (US);
Joseph F. Ryan, Worcester, MA (US);
Jose Umana, Somerville, MA (US)

(73) Assignee: Precision Digital Corporation, Holliston, MA (US)

(*) Notice: Subject to any disclaimer, the term of this patent is extended or adjusted under 35 U.S.C. 154(b) by 403 days.

(21) Appl. No.: 12/422,597

(22) Filed: Apr. 13, 2009

(65) Prior Publication Data
US 2010/0258331 A1 Oct. 14, 2010

(51) Int. Cl.
*H01J 5/00* (2006.01)
*H01J 15/00* (2006.01)
*H05K 5/06* (2006.01)

(52) U.S. Cl. ... 174/50.54; 174/50; 174/50.5; 174/50.51; 310/89; 361/659; 361/664; 361/666; 361/667

(58) Field of Classification Search ............... 174/50, 174/50.5, 50.51, 50.54; 310/89; 361/659, 361/664, 666, 667; *H01J 5/00, 15/00; H05K 5/06*
See application file for complete search history.

(56) References Cited

U.S. PATENT DOCUMENTS

| | | | |
|---|---|---|---|
| 3,364,346 A * | 1/1968 | Gunn | 362/264 |
| 3,582,535 A * | 6/1971 | Appleton | 174/562 |
| 3,800,268 A | 3/1974 | Bruckner et al. | |
| 3,974,933 A * | 8/1976 | Toth et al. | 220/3.8 |
| 4,129,896 A | 12/1978 | Young | |
| 4,142,179 A * | 2/1979 | Lowndes | 340/321 |
| 4,142,535 A * | 3/1979 | Perkins et al. | 131/355 |
| 4,156,891 A | 5/1979 | Roche | |
| 4,164,145 A * | 8/1979 | Aron | 73/293 |
| 4,213,018 A | 7/1980 | Piston | |
| 4,261,100 A | 4/1981 | Piston | |
| 4,399,452 A | 8/1983 | Nakashima et al. | |
| 4,496,790 A * | 1/1985 | Spencer | 174/484 |
| 4,638,297 A | 1/1987 | Roots | |
| 4,664,281 A | 5/1987 | Falk et al. | |
| 4,841,418 A | 6/1989 | Davis | |
| 4,912,329 A | 3/1990 | Weiner | |
| 5,159,949 A | 11/1992 | Prescott et al. | |
| 5,278,543 A | 1/1994 | Orth et al. | |
| 5,391,091 A * | 2/1995 | Nations | 439/378 |
| 5,654,047 A | 8/1997 | Watanabe et al. | |
| 5,821,695 A | 10/1998 | Vilanilam et al. | |
| 6,144,548 A | 11/2000 | Kerchaert | |
| 6,165,009 A | 12/2000 | Anbo et al. | |
| 6,331,674 B1 * | 12/2001 | Zolock et al. | 174/60 |
| 6,392,322 B1 | 5/2002 | Mares et al. | |

(Continued)

*Primary Examiner* — John K Kim
(74) *Attorney, Agent, or Firm* — Weingarten, Schurgin, Gagnebin & Lebovici LLP

(57) ABSTRACT

A system for enclosing an instrument, module or other assembly in an explosion-proof housing. The system includes an upper housing portion that includes a first threaded portion and, optionally, a transparent window portion; a lower housing portion that has a second threaded portion that is structured and arranged to cooperate with the first threaded portion to provide a tight, air- and water-tight fit; and an inner mounting assembly for supporting an instrument, module, electrical circuit, electrical device, display device, or other assembly. In pertinent part, the lower housing portion includes integrated bosses that provide horizontal surfaces for supporting the inner mounting assembly and for releasably attaching the inner mounting assembly to the lower housing portion. The number of positioning of the bosses and the number and positioning of mounting studs on the inner mounting assembly are designed to mount the inner mounting assembly within the lower housing portion in a manner that is independent of the mounting orientation of the lower housing portion.

5 Claims, 5 Drawing Sheets

U.S. PATENT DOCUMENTS

| | | | |
|---|---|---|---|
| 6,417,446 B1 * | 7/2002 | Whitehead | 174/484 |
| 6,522,124 B1 | 2/2003 | Ballard | |
| 6,528,986 B2 | 3/2003 | Ballard | |
| 6,614,219 B2 | 9/2003 | Dadian | |
| 6,754,067 B2 * | 6/2004 | Turner et al. | 361/659 |
| 6,794,991 B2 | 9/2004 | Dungan | |
| 6,838,867 B2 * | 1/2005 | Loy | 324/142 |
| 6,852,930 B1 * | 2/2005 | Babiarz et al. | 174/100 |
| 6,882,523 B2 * | 4/2005 | Turner et al. | 361/659 |
| 6,967,402 B2 | 11/2005 | Hiyoshi | |
| 7,014,502 B2 * | 3/2006 | Rasmussen | 439/578 |
| 7,265,966 B2 | 9/2007 | Dudley | |
| 7,395,692 B2 | 7/2008 | Wansing | |
| 7,656,649 B2 * | 2/2010 | Loy et al. | 361/659 |
| 7,743,641 B2 * | 6/2010 | Bailey et al. | 73/23.42 |
| 2004/0194994 A1 * | 10/2004 | Rasmussen | 174/76 |
| 2005/0179447 A1 * | 8/2005 | Groover et al. | 324/662 |
| 2006/0283631 A1 * | 12/2006 | Drane | 174/480 |
| 2010/0258331 A1 * | 10/2010 | Dahlgren et al. | 174/50.54 |

* cited by examiner

US 8,227,692 B2

EXPLOSION-PROOF ENCLOSURE

CROSS REFERENCE TO RELATED APPLICATIONS (Not Applicable)

STATEMENT REGARDING FEDERALLY SPONSORED RESEARCH OR DEVELOPMENT (Not applicable)

BACKGROUND OF THE INVENTION

An enclosure for containing an electrical meter or other instrument, module or device in an explosion-proof manner is disclosed.

Explosion-proof enclosures or housings are generally known for containing electrical and electronic equipment which is used in hazardous environments in which a spark or flame could ignite flammable gasses or other constituents in the operating environment. Explosion-proof housings are designed and constructed to meet industry standards such as the explosion-proof standards contained in the National Electrical Code (NEC). Such explosion-proof housings generally comprise a first housing portion which contains the associated meter or other instrument or device, and a second housing portion threadably attached to the first housing portion to fully enclose the device. Housing of known construction have deficiencies which limit their applicability and which limit their ease of use. Conventional housings usually require internal electrical fittings which must be carefully aligned to properly seat and install the electrical device being contained in the housing. Often such fittings must be preassembled in the housing before installation of the device. Examples of known explosion-proof housings are shown in U.S. Pat. Nos. 6,882,523 and 7,233,154.

BRIEF SUMMARY OF THE INVENTION

In accordance with the invention, an explosion-proof enclosure is provided for containing an electrical meter or other instrument, module or device. The enclosure includes a lower housing portion adapted to be mounted on a mounting surface or structure, an inner mounting assembly to which the meter or other device can be attached, and an upper housing portion which is threadably attachable to the lower housing portion to fully enclose the meter or other device. The upper housing portion has a transparent window for viewing the visual display of the meter or other device. The lower portion has a plurality of bosses that are spaced about the periphery of the interior chamber of the lower housing portion. The inner mounting assembly contains a plurality of recesses about the periphery thereof that cooperate with the bosses of the lower housing portion and which allow the mounting assembly and device attached thereto to be oriented in different rotational positions. The mounting and the device attached thereto can be oriented to readily read the display of the mounted device irrespective of the orientation of the mounted lower housing portion.

BRIEF DESCRIPTION OF THE SEVERAL VIEWS OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
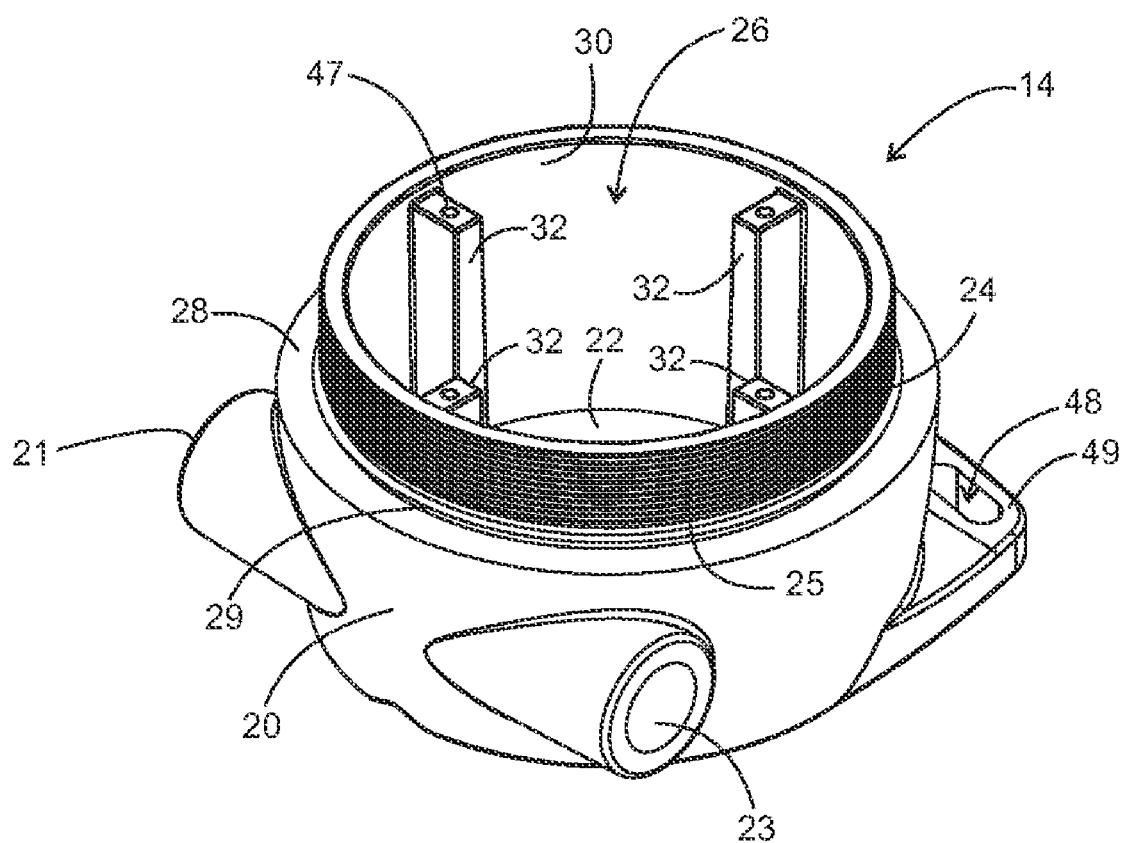
FIG. 1 shows an isometric view of a lower housing portion in accordance with the present invention.

Referring to FIGS. 1-5, there are shown various views of an explosion-proof enclosure. The enclosure 10 includes an upper housing portion 12, a lower housing portion 14, and an inner mounting assembly or module 16. The upper and lower housing portions 12 and 14 are fabricated of a material, e.g., steel, cast iron, and the like, that is capable of preventing a spark or flame from within the housing from reaching the environment external to the enclosure. Preferably the upper and lower housing portions are each cast as a single integral unit. The inner mounting assembly or module 16 is fabricated from a durable and preferably non-conductive material such as plastic.

The lower housing portion 14 (FIG. 1) includes a sidewall portion 20, a bottom portion 22, and a threaded attachment portion 24, which are structured and arranged to provide an open chamber 26 therein. The chamber 26 accommodates the device and associated wiring, fittings, and the like.

The sidewall portion 20 is substantially cylindrical and includes a substantially planar rim portion 28 and first and second ports 21 and 23 into each of which a conduit (not shown) for cables, wires, and the like can be threaded or otherwise affixed. Although the sidewall portion 20 shown in FIG. 1 is substantially cylindrical and two ports 21 and 23 are also shown, this is for illustrative purposes only. The sidewall portion 20 can have a shape other than cylindrical and the number of ports can be more than or less than two. In addition, the ports may be differently disposed than the illustrated embodiment in which the ports are in line with each other.

The attachment portion 24 is substantially cylindrical and further structured to include threads 25 for releasably attaching the lower housing portion 14 and the upper housing portion 12. Preferably, a sealing element, such as an O-ring 15, is disposed in a groove 29 adjacent to the rim 28 for providing an air- and water-tight seal between the upper and lower housing portions 12 and 14 when the upper and lower housing portions 12 and 14 are in threaded attachment.

Within the chamber 26 of the lower housing portion 14 and along the inner face 30 of the sidewall portion 20 is a plurality of bosses or ribs 32. The bosses 32 are spaced about the periphery of the chamber and preferably are integrally formed with the lower housing portion 14. Alternatively, the bosses 32 can be separate elements which are attached to the lower housing portion 14. Although four bosses 32 are shown in FIG. 1, the invention is not to be construed as being limited to four as the number of bosses 32 can be greater than or fewer than four.

Figure 2:
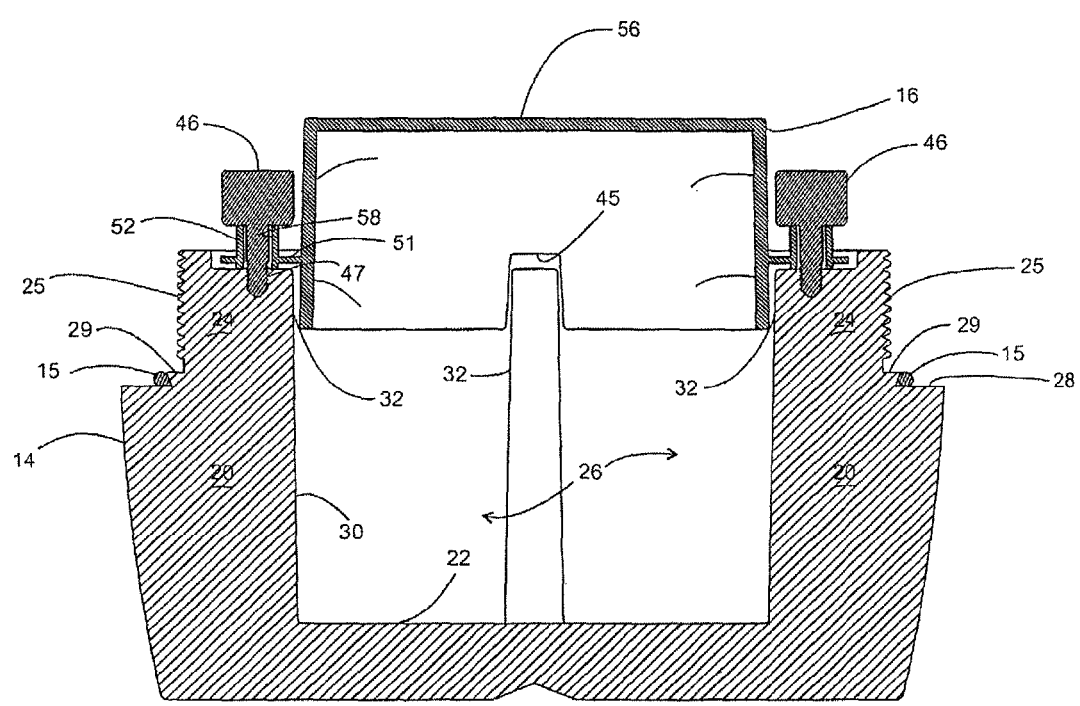
FIG. 2 shows a cross section of a lower housing portion with an inner mounting assembly attached thereto in accordance with the present invention.

The bosses 32 serve two primary purposes. First, they provide structural support and reinforcement to the lower housing portion 14. Second, the bosses 32 provide guides for orienting and supporting the inner mounting assembly or module 16. As will be further described below, the mounting assembly has recesses which are cooperative with the bosses to orient and mount the mounting assembly 16 in the chamber 26. After installation of the mounting assembly 16 in an intended position in chamber 26, the mounting assembly can be secured by an appropriate fastener. For example, as shown in FIG. 1 and FIG. 2, each boss 32 can include a threaded opening 47 for receiving a fastener 46, such as a thumbscrew, machine screw or bolt.

For mounting the enclosure 10 to an external surface or structure, the lower housing portion 14 includes mounting flanges 49 that each include an opening 48 through which a fastener or other mounting element (not shown) can be accommodated. The flanges 49 and openings 48 are adapted to attach the enclosure 10 to a supporting structure, e.g., wall, beam, column, and so forth, in any orientation so that the first and second ports 21 and 23 are oriented horizontally, vertically or at any angle therebetween.

As mentioned above, the plural bosses 32 also provide multiple guides for supporting and/or securing the mounting assembly or module 16. Advantageously, the plural bosses 32 enable mounting the mounting assembly or module 16 to the lower housing portion 14 independently of the orientation of the mounted lower housing portion 14. Consequently, the mounting assembly or module 16 can be disposed against and attached to the plural bosses 32 so that the device contained in the chamber 26 is always right-side up or otherwise oriented to facilitate observing the display of the device regardless of how the lower housing portion 14 is externally mounted. In the illustrated embodiment, four bosses 32 are provided in the lower housing portion 14 and cooperate with four recesses in the mounting assembly 16 to provide four different mounting positions for the mounting assembly and device attached thereto.

The upper housing portion 12 (FIG. 3 through FIG. 5) includes a sidewall portion 34 and a top portion 36 that are structured and arranged to provide a chamber 38 that provides space for the portion of the mounting assembly 16 and device attached thereto which extends outwardly of the lower housing portion 14.

The top portion 36 of the upper housing portion 12 includes a transparent window 31 for viewing a readout or display of the meter, instrument or other device contained within the chambers of the housing. The window 31 can be made, for example, of glass, acrylic, polycarbonate, and the like, and is in sealing engagement with the surrounding portion of the housing 12.

The upper housing portion 12 includes a circular groove 71 in which a first O-ring 75 or other sealing element is disposed. The first O-ring 75 is seated in the circular groove 71 and is structured and arranged to abut the confronting surface of the window 31, to provide an air- and water-tight seal. The window 31 is retained in place by a retaining ring 73 that is adapted to exert pressure against the window 31 to form the seal with the first O-ring 75.

The retaining ring 73 also includes a circular groove 72 in which a second O-ring 79 or other sealing element is disposed. The second O-ring 79 is structured and arranged to abut the reverse surface of the window 31, so that when the retaining ring 73 is inserted in the housing portion and tightened, the second O-ring 79 provides another air- and water-tight seal.

Figure 5:
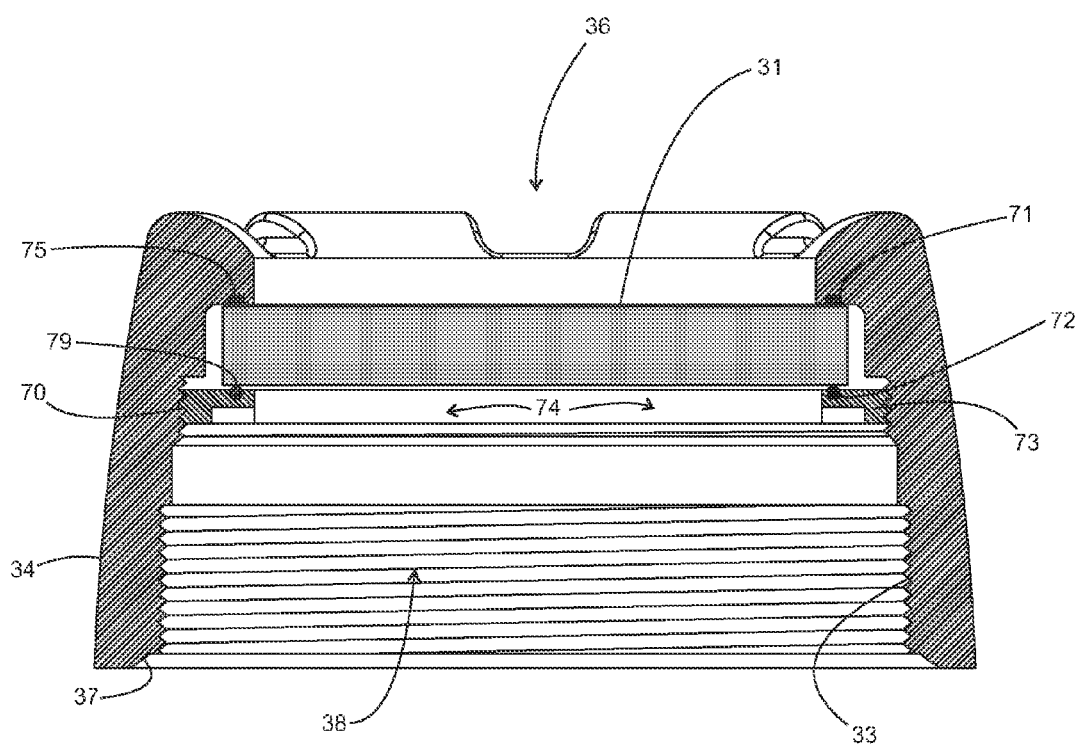
FIG. 5 shows a cross-sectional view of the upper housing portion in accordance with the present invention.

The retaining ring 73 is operatively disposed within the chamber 38 of the upper housing portion 12. In one embodiment, the retaining ring 73 is threaded about its outer periphery. The threads in the retaining ring 73 mate with threadings 70 within the chamber 38 of the upper housing portion 12. By threading the retaining ring 73 within the chamber 38 of the upper housing portion 12, the retaining ring 73 will exert pressure against the second O-ring 79 and against the window 31. The window is retained in sealing engagement with the upper housing portion 12 to provide an air- and water-tight seal. Although FIG. 5 shows that the retaining ring 73 is threaded into a threaded portion 74 of the chamber 38 that is separate from the internal threaded attachment portion 33 for attaching the upper housing portion 12 to the lower housing portion 14, this is done for illustrative purposes only. The internal threaded attachment portion 33 for attaching the upper housing portion 12 to the lower housing portion 14, could, instead, be continuous so that the outer periphery of the retaining ring 73 mates with continuous internal threaded attachment portion 33, rather than a separate set of threadings 70.

For applications in which the meter or other device contained in the enclosure has no display to be read by a user, the window 31 can be eliminated and in its place, a blind cover can be provided. Alternatively, the upper housing portion can be integrally formed with a solid cover portion.

Figure 3:
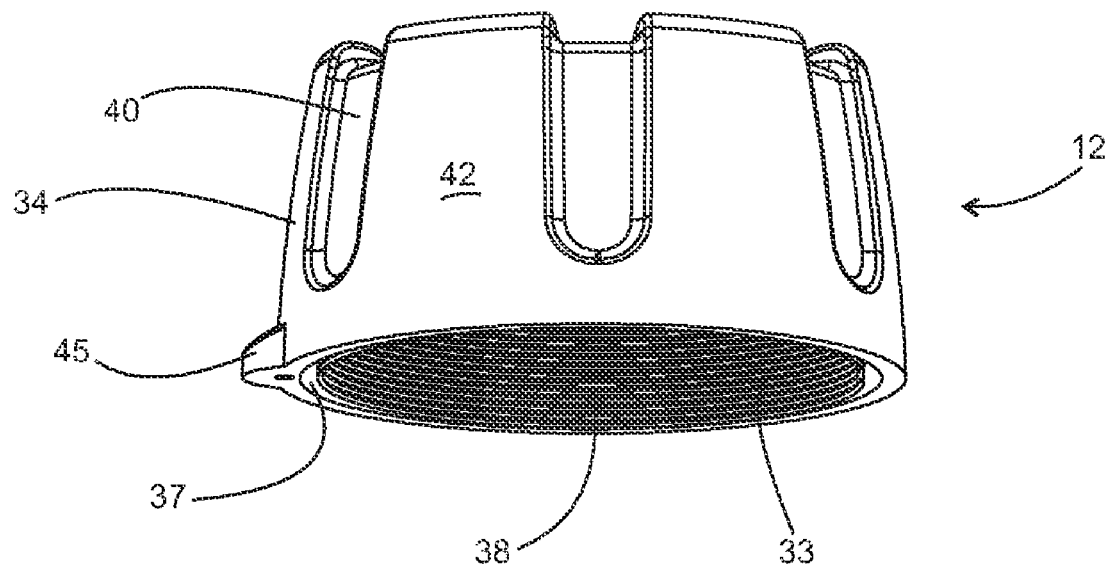
FIG. 3 shows an isometric view of an upper housing portion in accordance with the present invention.
Figure 4:
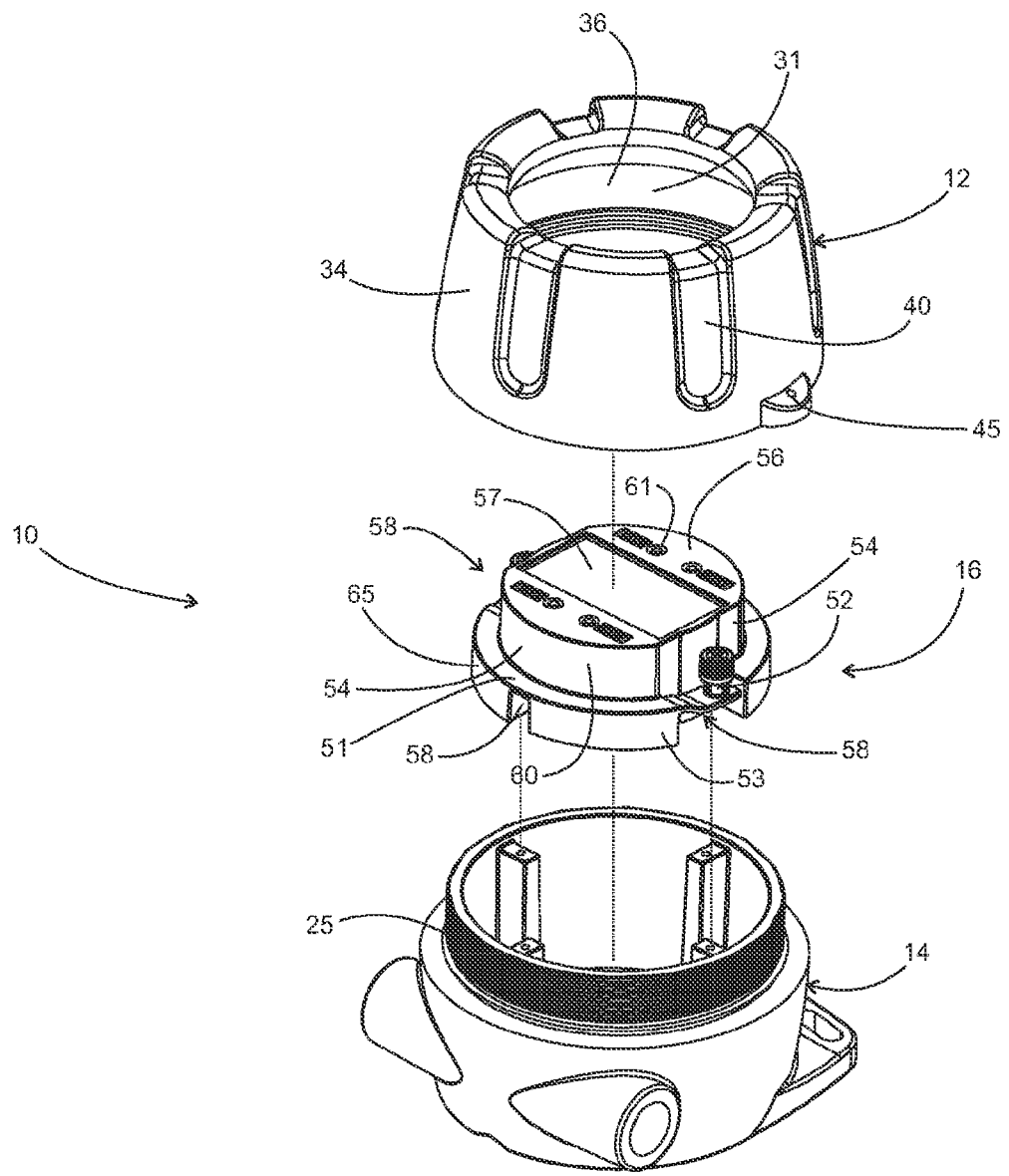
FIG. 4 shows an exploded view of the lower housing portion, inner mounting assembly and upper housing portion in accordance with the present invention.

The sidewall portion 34 shown in FIGS. 3 through 5 is substantially cylindrical and includes a threaded attachment portion 33 and a beveled portion 37. Grooves 40 for accommodating human fingers can be provided on the exterior surface 42 of the sidewall portion 34, to facilitate rotation and threading of the upper housing portion 12 to the lower housing portion 14. The internal threaded attachment portion 33 mates with the external threaded portion 25 of the lower housing portion 14.

The beveled portion 37 is disposed at the bottom portion of the sidewall portion 34. The beveled portion 37 is adapted to accommodate an O-ring 15 that has been fitted onto the rim portion 28 of the lower housing portion 14, to provide an air- and water-tight seal when the upper and lower housing portions 12 and 14 are in threaded attachment. Also, disposed on the exterior surface 42 of the sidewall portion 34 of the upper housing portion 12 is a locking device 45, such as a locking screw, for releasably locking the upper and lower housing portions 12 and 14.

The inner mounting assembly or module 16 is structured and arranged to accommodate and support at least one meter, instrument, or other electrical device. Referring to FIG. 2 and FIG. 4, the inner mounting assembly or module 16 includes a first cylindrical portion 65, a second cylindrical portion 60, and a planar portion 51 that is orthogonal or substantially orthogonal to each of the cylindrical portions 65 and 60 and that connects the first cylindrical portion 65 to the second cylindrical portion 60.

The first cylindrical portion 65 of the inner mounting assembly or module 16 includes a plurality of recesses 58 that are configured to be cooperative with the bosses 32 of the lower housing portion 14 and one or more attachment studs 52 that is disposed on the planar portion 51. The second cylindrical portion 60 is stepped inwardly from the first portion 65 and has openings 57 and 61 and threaded studs (not shown) for receiving a meter or other device mounted thereto. The mounting assembly 16 can be configured with openings and mounting elements to accommodate a particular type of device or a range of device types.

The mounting assembly 16 and the device attached thereto is positioned in the lower housing portion 14 with the recesses 58 of the mounting assembly in cooperative engagement with the bosses 32. The mounting assembly 16 is secured in position by one or more fasteners 46 which extend through associated mounting studs 52 into threaded attachment with threaded holes 47 on the outer surface of respective bosses 32.

In the illustrated embodiment, the mounting assembly 16 is secured in the lower housing portion 14 by two diametrically positioned fasteners 46. It will be appreciated that in some instance a single fastener 46 can suffice to secure the mounting assembly 16, while in other instances, a fastener 46 may be employed for attachment to each of the bosses 32 of the lower housing portion 14.

It will be further appreciated that the configuration of the inner mounting assembly 16 can vary to suit the particular meter or other device to be attached thereto. In use, the meter or other device is attached to the mounting assembly 16 by suitable fasteners or other attachment elements, and electrical connection is made to the device by wires which extend into the housing chamber via the one or more conduits.

Internal wiring within the explosion-proof is highly variable being determined, in large part, by the particular internal device and the end-user application. Wiring can include—for purposes of illustration and not limitation—analog and/or digital input signals and/or serial communication lines that represent an industrial process variable or that are used for process control and/or transmission or retransmission of the input; contact closure, i.e. relay, or transistor output that are used for alarm indication and/or process control; DC voltage output supply for powering an external device; and DC or AC voltage input supply for powering an internal device.

Many changes in the details, materials, and arrangement of parts and steps, herein described and illustrated, can be made by those skilled in the art in light of teachings contained hereinabove. Accordingly, it will be understood that the following claims are not to be limited to the embodiments disclosed herein and can include practices other than those specifically described, and are to be interpreted as broadly as allowed under the law.

What is claimed is:

1. An explosion-proof housing for containing an electrical meter having a visual display comprising:
    a first housing portion having a first sidewall with an inner face defining a first chamber having an open end, a closed top having a transparent window, and a first threaded portion about the open end of the first sidewall;
    a second housing portion having:
        a second sidewall with an inner face defining a second chamber having an open end and a closed bottom portion, the bottom portion having a mounting surface and at least one mounting flange integral therewith and operative to attach the housing to a mounting structure;
        at least one port integral with the second sidewall and communicating with the second chamber and to which an electrical conduit can be attached;
        a second threaded portion about the open end of the second sidewall that is matable with the first threaded portion to provide an air and/or water-tight seal between the first and second housing portions; and
        a plurality of elongated ribs that are spaced apart about the periphery of the inner face of the second sidewall; wherein each of the spaced apart ribs is integral with or fixedly attached to the inner face of the second sidewall and extends laterally from the inner face of the second sidewall into the second chamber and longitudinally from the open end of the chamber to the bottom of the second chamber, each end of the respective ribs facing the open end of the second chamber defining a mounting surface; and
    an inner mounting assembly for supporting the electrical meter in the second housing portion, and having a first peripheral wall including a plurality of recesses about the periphery thereof configured to be slidably fitted around and cooperative with the plurality of ribs to orient the inner mounting assembly and the electrical meter supported thereon in the second housing portion in different rotational positions in the second chamber, at least some of the recesses having a mounting end attachable to the mounting surface of respective ones of the ribs to secure the inner mounting assembly to the second housing portion in an intended rotational position such that the electrical meter supported in the housing is in a readable orientation irrespective of the orientation of the housing mounted to a mounting structure.

2. The housing as recited in claim 1, wherein the first housing portion includes a locking device for fixedly attaching the second housing portion to the first housing portion.

3. The housing as recited in claim 1, wherein the plurality of bosses comprises four bosses.

4. The housing as recited in claim 1 wherein the ribs are integral with the inner face of the second sidewall and each includes a threaded opening in the end facing the open end of the second chamber.

5. The housing as recited in claim 1 wherein the inner mounting assembly includes a second peripheral portion outward of the first peripheral wall and having one or more openings to accommodate the electrical meter on the second peripheral portion.

* * * * *